(12) United States Patent
Cho et al.

(10) Patent No.: US 7,652,352 B2
(45) Date of Patent: Jan. 26, 2010

(54) ACTIVE STRUCTURE OF A SEMICONDUCTOR DEVICE

(75) Inventors: Whee Won Cho, Cheongju-Si (KR); Seong Hwan Myung, Suwon-Si (KR); Eun Jung Ko, Icheon-Si (KR)

(73) Assignee: Hynix Semiconductor Inc., Icheon-si (KR)

(*) Notice: Subject to any disclaimer, the term of this patent is extended or adjusted under 35 U.S.C. 154(b) by 17 days.

(21) Appl. No.: 11/771,484

(22) Filed: Jun. 29, 2007

(65) Prior Publication Data
US 2008/0224272 A1    Sep. 18, 2008

(30) Foreign Application Priority Data
Mar. 14, 2007    (KR) ................ 10-2007-0025117

(51) Int. Cl.
*H01L 29/06*    (2006.01)
(52) U.S. Cl. ............... 257/622; 257/321; 257/E29.002
(58) Field of Classification Search ................ 257/499, 257/622, 259, 295, 321, 390, E29.002, E49.001, 257/E21.621
See application file for complete search history.

(56) References Cited
U.S. PATENT DOCUMENTS
2007/0148840 A1* 6/2007 Sheen et al. ............... 438/197

FOREIGN PATENT DOCUMENTS
| KR | 10-200-0047753 | 7/2000 |
| KR | 10-2004-0093304 | 11/2004 |
| KR | 10-2005-0069617 | 7/2005 |

* cited by examiner

*Primary Examiner*—Thomas L Dickey
*Assistant Examiner*—Fazli Erdem
(74) *Attorney, Agent, or Firm*—Marshall, Gerstein & Borun LLP

(57) ABSTRACT

An active structure of a semiconductor device. In one aspect, the active structure of the semiconductor device includes first to $(n)^{th}$ field regions, and first to $(n+1)^{th}$ active regions formed alternately with the first to $(n)^{th}$ field regions, wherein one or more of the first to $(n+1)^{th}$ active regions are connected at edge portions thereof to close one or more of the field regions. In another aspect, the active structure of the semiconductor device includes first to $(n)^{th}$ field regions, and first to $(n+1)^{th}$ active regions formed alternately with the first to $(n)^{th}$ field regions, wherein the first and $(n+1)^{th}$ active regions are connected to $(n+2)^{th}$ and $(n+3)^{th}$ active regions at edge portions thereof, closing the field regions.

8 Claims, 4 Drawing Sheets

ACTIVE STRUCTURE OF A SEMICONDUCTOR DEVICE

CROSS-REFERENCE TO RELATED APPLICATION

The priority of Korean patent application number 2007-25117, filed on Mar. 14, 2007, the disclosure of which is incorporated by reference in its entirety, is claimed.

BACKGROUND OF THE INVENTION

The invention relates to semiconductor devices and, more particularly, to an active structure of a semiconductor device, wherein an isolation layer having trench gap-fill capability within a field region can be formed, although flowable insulating material is used.

As semiconductor devices become more highly integrated, isolation layer formation processes become more difficult to carry out. Thus, isolation layers are typically is formed by Shallow Trench Isolation (STI) methods of forming trenches in a semiconductor substrate, with burying of the trenches. However, in the case of highly integrated devices, the depth of the trench is deeper than the entry width of the trench. Thus, it is very difficult to fill the trenches without forming of voids. This is because the deposition speed is faster at the entry of the trench than at the bottom of the trench when filling the trench with the oxide layer, and an overhang phenomenon in which the entry of the trench is clogged as the oxide layer is deposited is generated, generating a void within the trench.

In order to solve this problem, a method of filling the trench with Spin On Dielectric (SOD) or Spin On Glass (SOG) material has been introduced. In particular, there is a method of fully gap-filling the trench by using PSZ (polysilazane) having flow properties similar to those of water due to low viscosity in the SOD material.

However, in the prior art, since active regions in the device are separated from each other, an edge portion of the field region is opened. Thus, if the trench is gap filled with flowable insulating material, such as PSZ material, deposition material runs down from the edge portion of the field region. Accordingly, the thickness of the film is lowered and gap-filling is difficult.

SUMMARY OF THE INVENTION

Accordingly, the invention provides an active structure of a semiconductor device, wherein an isolation layer having the trench gap-fill capability within a field region can be found although flowable insulating material is used.

In one aspect, the active structure of the semiconductor device includes first to $(n)^{th}$ field regions, and first to $(n+1)^{th}$ active regions formed alternately with the first to $(n)^{th}$ field regions, wherein one or more of the first to $(n+1)^{th}$ active regions are connected at edge portions of the active regions to close one or more of the field regions. In another aspect, the active structure of the semiconductor device includes first to $(n)^{th}$ field regions, and first to $(n+1)^{th}$ active regions formed alternately with the first to $(n)^{th}$ field regions, wherein the first and $(n+1)^{th}$ active regions are connected to $(n+2)^{th}$ and $(n+3)^{th}$ active regions at edge portions of the active regions, closing the field regions.

DESCRIPTION OF SPECIFIC EMBODIMENTS

Specific embodiments according to the invention are described below with reference to the accompanying drawings.

Figure 1A:
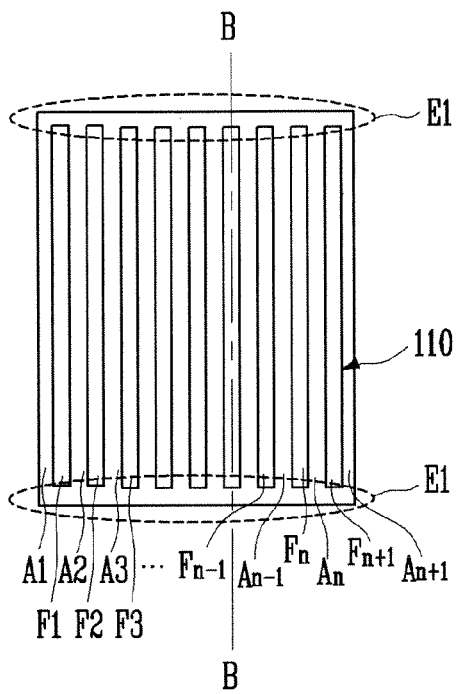
FIGS. 1A and 1B are layout diagrams illustrating, in a process sequence, an active structure of a semiconductor device according to a first embodiment of the invention.
Figure 1B:
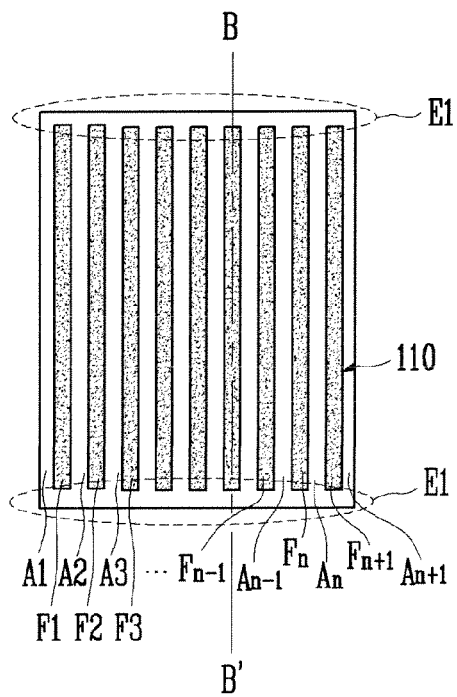

FIGS. 1A and 1B are layout diagrams illustrating, in a process sequence, an active structure of a semiconductor device according to a first embodiment of the invention.

Referring to FIG. 1A, first to $(n)^{th}$ field regions F1 to Fn are formed in a semiconductor substrate, and first to $(n+1)^{th}$ active regions A1 to An+1 are formed alternately with the first to $(n)^{th}$ field regions F1 to Fn. One or more of the first to $(n+1)^{th}$ active regions A1 to An+1 are connected at an edge portion E1, closing one or more of the field regions F1 to Fn. The field regions F1 to Fn have a trench (110) structure.

If flowable insulating material is used when forming an isolation layer in a subsequent process, it is preferred that the edge portions E1 of the first to $(n+1)^{th}$ active regions A1 to An+1 all be connected to close all the field regions F1 to Fn in order to improve the trench gap-fill capability at the edge portions E1 of each of the field regions F1 to Fn.

Referring to FIG. 1B, an isolation layer 120 is formed in the trench 110 within the field regions F1 to Fn of FIG. 1A. The isolation layer 120 can be formed using any suitable insulating material, preferably SOD or SOG material having good gap-fill capability.

Although the flowable SOD material is applied when forming the isolation layer 120 in the field regions F1 to Fn closed by one or more of the active regions A1 to An+1, deposition material does not run down from the edge portions E1 of the field regions F1 to Fn, unlike in the prior art. Accordingly, the gap-fill characteristic of the trenches 110 can be improved not only at the center of the field regions F1 to Fn, but also at the edge portions E1.

Figure 2A:
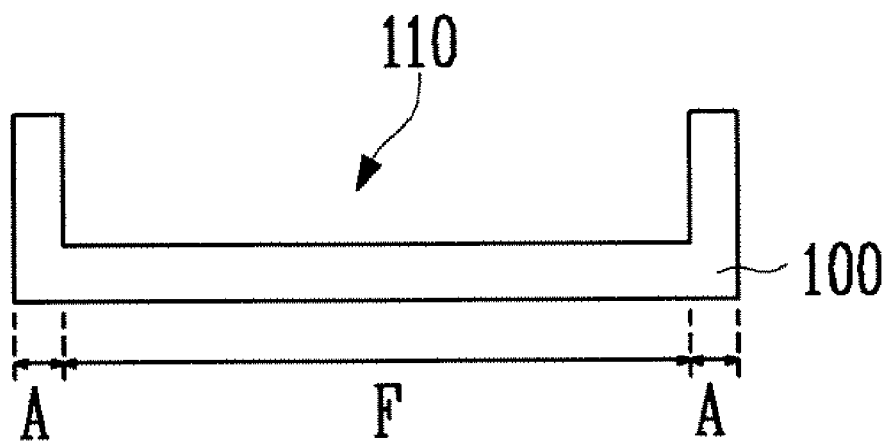
FIGS. 2A and 2B are cross-sectional views illustrating of the semiconductor device taken along line B-B' in FIGS. 1A and 1B.
Figure 2B:
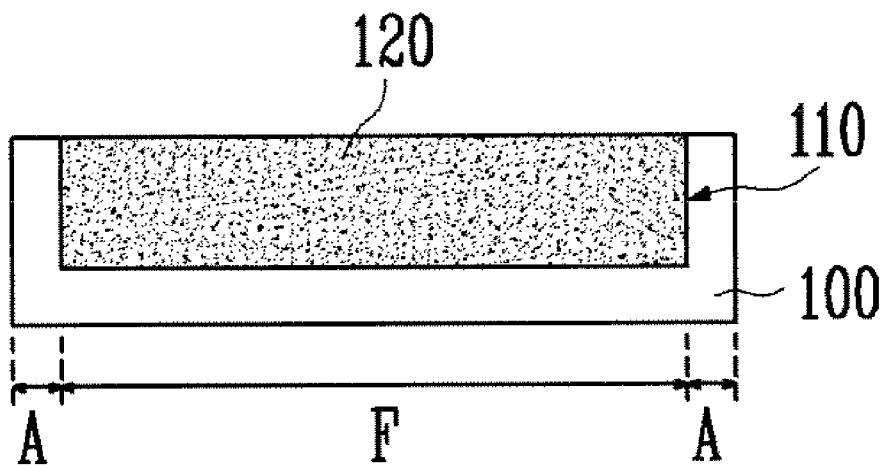

FIGS. 2A and 2B are cross-sectional views illustrating of the semiconductor device taken along line B-B' in FIGS. 1A and 1B.

Referring to FIG. 2A, photoresist is coated on a semiconductor substrate 100 including an active region A and a field region F, forming a photoresist layer (not illustrated). A photoresist pattern (not illustrated) is then formed by exposure and development employing predetermined reticles. The field region F of the semiconductor substrate 100 is etched to a specific thickness by means of an etch process using the photoresist pattern as a mask. Thus, trenches 110 are formed in the field region F of the semiconductor substrate 100, and the trenches 110 are closed by the active regions A.

Referring to FIG. 2B, insulating material is deposited on the semiconductor substrate 100 including the trenches 110, so that an isolation layer 120 is formed only in a region in which the trenches 110 of the field region F are formed. The isolation layer 120 can be formed by using any suitable insulating material, preferably SOD or SOG material having good gap-fill capability. Thus, the active region A and the field region F are defined by the isolation layer 120. As described above, since the field region F including the trenches 110 is closed by the active regions A, the gap-fill characteristic of the trenches 110 can be improved although flowable SOD material is used when forming the isolation layer 120.

Figure 3A:
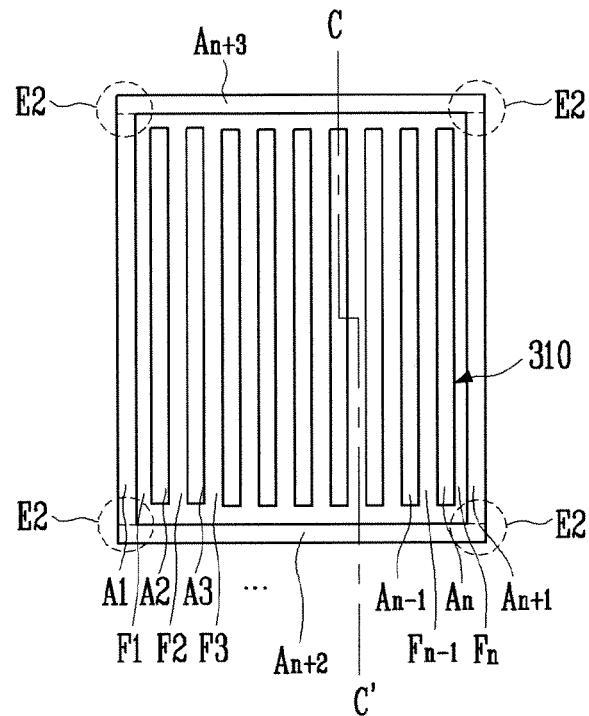
FIGS. 3A and 3B are layout diagrams illustrating, in a process sequence, an active structure of a semiconductor device according to a second embodiment of the invention.
Figure 3B:
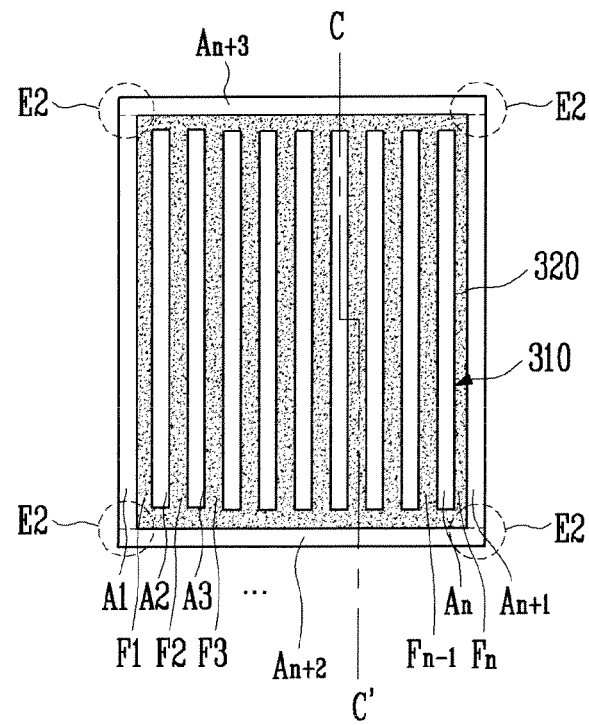

FIGS. 3A and 3B are layout diagrams illustrating, in a process sequence, an active structure of a semiconductor device according to a second embodiment of the invention.

Referring to FIG. 3A, first to $(n)^{th}$ field regions F1 to Fn are formed in a semiconductor substrate, and first to $(n+1)^{th}$ active regions A1 to An+1 are formed alternately with the first to $(n)^{th}$ field regions F1 to Fn. The first and $(n+1)^{th}$ active region A1 to An+1 are connected to $(n+2)^{th}$ and $(n+3)^{th}$ active regions An+2 and An+3 at an edge portions E2, closing the field regions F1 to Fn. In this case, the field regions F1 to Fn have a trench (310) structure. Meanwhile, the second to $(n)^{th}$ active regions A2 to An are isolated by the closed field regions F1 to Fn.

Referring to FIG. 3B, an isolation layer 320 is formed in the trenches 310 within the field regions F1 to Fn of FIG. 3A. The isolation layer 320 can be formed by using any suitable insulating material, preferably SOD or SOG material having a good gap-fill capability.

The $(n+2)^{th}$ and $(n+3)^{th}$ active regions An+2 and An+3 are connected to the edge portions E2 of the first and $(n+1)^{th}$ active regions A1 and An+1, closing the field regions F1 to Fn. Accordingly, although flowable SOD material is used to form the isolation layer 320 in each of the field regions F1 to Fn, deposition material does not run down from the edge portions of the field regions F1 to Fn unlike in the prior art. It is therefore possible to improve the gap-fill characteristic of the trenches 310 not only at the center of the field regions F1 to Fn, but also at the edge portions thereof.

Figure 4A:
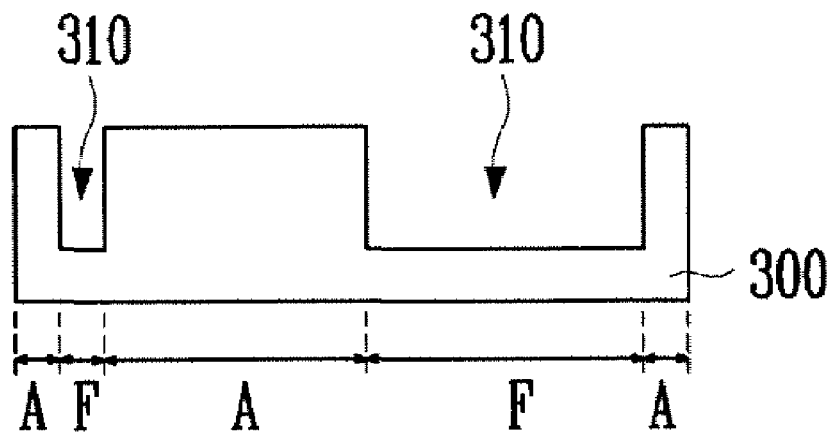
FIGS. 4A and 4B are cross-sectional views illustrating of the semiconductor device taken along line C-C' in FIGS. 3A and 3B.
Figure 4B:
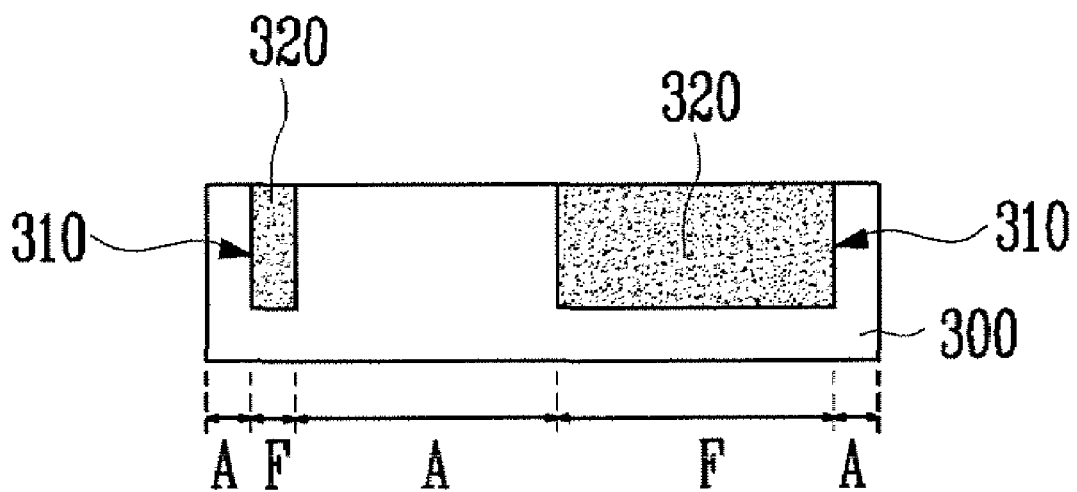

FIGS. 4A and 4B are cross-sectional views illustrating of the semiconductor device including along line C-C' in FIGS. 3A and 3B. A manufacturing method according to a second embodiment of the invention is briefly described below.

Referring to FIG. 4A, photoresist is coated on the semiconductor substrate 300 including the active region A and the field region F, forming a photoresist layer (not illustrated). Exposure and development are then performed to form a photoresist pattern (not illustrated). Thereafter, the field region F of the semiconductor substrate 300 is etched to a desired thickness by an etch process using the photoresist pattern as a mask. Accordingly, the trenches 310 are formed in the field region F of the semiconductor substrate 300, and the trenches 310 are closed by the active regions A.

Referring to FIG. 4B, insulating material is deposited on the semiconductor substrate 300 including the trenches 310, forming the isolation layer 320 only in the region in which the trenches 310 of the field region F are formed. In this case, the isolation layer 320 can be formed by using any suitable insulating material, preferably SOD or SOG material having good gap-fill capability. Accordingly, the active region A and the field region F are defined by the isolation layer 320. As described above, since the field region F including the trenches 310 is closed by the active regions A, the gap-fill characteristic of the trenches 310 can be improved although flowable SOD material is used to form the isolation layer 320.

As described above, according to the invention, the active structure is changed in order to close the field region. Thus, although flowable insulating material is used when forming an isolation layer, deposition material can be prevented from running down from edge portions of the field region. Accordingly, an isolation layer having a good trench gap-fill capability can be formed.

Although the foregoing description has been made with reference to the specific embodiments, changes and modifications of the disclosure may be made by the ordinary skilled in the art without departing from the spirit and scope of the invention as defined in the appended claims.

What is claimed is:

1. An active structure of a semiconductor device, comprising:
   first to $(n)^{th}$ field regions; and
   first to $(n+1)^{th}$ active regions formed alternately with the first to $(n)^{th}$ field regions, said active regions having first and second edge portions,
   wherein one or more of the first to $(n+1)^{th}$ active regions are connected to each other at the first and second edge portions of the active regions so that the field regions are isolated from each other.

2. The active structure of claim 1, wherein the field regions have a structure defined by trenches.

3. The active structure of claim 2, wherein an isolation layer is formed in the trenches.

4. An active structure of a semiconductor device, comprising:
   first to $(n)^{th}$ field regions; and
   first to $(n+1)^{th}$ active regions formed alternately with the first to $(n)^{th}$ field regions, said active regions having first and second edge portions;
   $(n+2)^{th}$ active regions connecting the first edge portions of the first active regions with the first edge portions of the $(n+1)^{th}$ active regions; and
   $(n+3)^{th}$ active regions connecting the second edge portions of the first active regions with the second edge portions of the $(n+1)^{th}$ active regions.

5. The active structure of claim 4, wherein the field regions have a structure defined by trenches.

6. The active structure of claim 5, wherein an isolation layer is formed in the trenches.

7. The active structure of claim 4, wherein the first to $(n)^{th}$ field regions are connected to each other at edge portions of the field regions.

8. The active structure of claim 7, wherein the filed regions isolate the second to $(n)^{th}$ active regions.

* * * * *

UNITED STATES PATENT AND TRADEMARK OFFICE
CERTIFICATE OF CORRECTION

PATENT NO. : 7,652,352 B2
APPLICATION NO. : 11/771484
DATED : January 26, 2010
INVENTOR(S) : Whee Won Cho et al.

Page 1 of 1

It is certified that error appears in the above-identified patent and that said Letters Patent is hereby corrected as shown below:

In the Claims

At column (4), line 32 should read:

4. An active structure of a semiconductor device, comprising:

first to $(n)^{th}$ field regions; and first to $(n+1)^{th}$ active regions formed alternately with the first to $(n)^{th}$ field regions, said active regions having first and second edge portions;

a $(n+2)^{th}$ active region connecting the first edge portion of the first active region with the first edge portion of the $(n+1)^{th}$ active region; and a $(n+3)^{th}$ active region connecting the second edge portion of the first active region with the second edge portion of the $(n+1)^{th}$ active region.

At column (4), line 62 should read:

8. The active structure of claim 7, wherein the field regions isolate the second to $(n)^{th}$ active regions.

Signed and Sealed this
Twenty-first Day of June, 2016

Michelle K. Lee
*Director of the United States Patent and Trademark Office*